United States Patent [19]
Barham et al.

[11] Patent Number: 5,875,218
[45] Date of Patent: Feb. 23, 1999

[54] VARIABLE RATE CLOCK FOR TIMING RECOVERY AND METHOD THEREFOR

[75] Inventors: Steven T. Barham; Samuel C. Kingston, both of Salt Lake City; Charles A. Small, Midvale, all of Utah

[73] Assignee: Unisys Corporation, Blue Bell, Pa.

[21] Appl. No.: 422,204

[22] Filed: Mar. 31, 1995

[51] Int. Cl.$^6$ .................................................. H03D 3/24
[52] U.S. Cl. .......................................... 375/376; 375/376
[58] Field of Search ...................................... 375/373, 376

[56] References Cited

U.S. PATENT DOCUMENTS

| | | | |
|---|---|---|---|
| 4,791,488 | 12/1988 | Fukazawa et al. | 358/149 |
| 4,896,337 | 1/1990 | Bushy, Jr. | 375/118 |
| 5,050,195 | 9/1991 | Munter | 375/119 |
| 5,272,730 | 12/1993 | Clark | 375/120 |
| 5,455,847 | 10/1995 | Guilford et al. | 375/373 |

*Primary Examiner*—Stephen Chin
*Assistant Examiner*—Mohammad Ghayour
*Attorney, Agent, or Firm*—John B. Sowell; Mark T. Starr; John F. O'Rourke

[57] ABSTRACT

Apparatus and method are provided that can be advantageously included in a timing phase-locked loop for finally adjusting the period of a timing signal being controlled by that loop. The loop filter receives the timing signal and generates a loop error signal indicative of whether the period of the timing signal should be held the same, increased or decreased. A strobe signal is also generated each time that the timing signal is to be so corrected. The error signal and strobe signal are provided to a function generator such as a state machine. Each time that the function generator is strobed by the strobe signal, it produces a count signal whose value is representative of N, N+C or N−C, where N and C are integers and C represents a preset desired increment of change for the timing signal per strobe, i.e. the fineness of the adjustment of the timing signal. When not strobed by the strobe signal, the state machine produces a count signal of value N. When the state machine is strobed by the strobe signal and the error signal indicates that the timing signal should be held as is, the state machine remains in a first state such that the count signal has a value of N. If the state machine is strobed by the strobe signal and the error signal indicates that the period of the timing signal should be increased, then the state machine moves to a second state such that a digital count signal of N+C is generated once, after which the state machine returns to the first state. If the state machine is strobed by the strobe signal and the error signal indicates that the period of the timing signal should be decreased, then the state machine is moved to a third state such that a digital count signal of N−C is produced once, after which the state machine returns to the first state. The count signal is provided in parallel to a divide-by counter, which also receives a clock signal having a fixed frequency N times the frequency of the timing signal. The counter divides the clock signal by the value of the count signal to produce the timing signal. This timing signal is provided to the loop filter. The timing signal can also be used for example to clock in data.

13 Claims, 9 Drawing Sheets

VARIABLE RATE CLOCK FOR TIMING RECOVERY AND METHOD THEREFOR

FIELD OF THE INVENTION

The present invention relates to communications such as pulse or digital communications, and more particularly to spread spectrum communications using plural paths or channels, such as direct sequence spread spectrum communications. The present invention also relates to communications such as pulse or digital communications, and more particularly to synchronizers with phase displacement, slip or jitter correction. The present invention further relates to electrical computers and data processing systems, and more particularly to digital filtering such as with finite arithmetic effects. The present invention still further relates to demodulators.

BACKGROUND OF THE INVENTION

There exist applications in which there is a need to provide a variable-rate clock for timing recovery in direct-sequence spread spectrum (DSSS) communication systems. The present invention fulfills that need.

Various direct-sequence spread spectrum (DSSS) communication systems are known. For example, see U.S. Pat. No. 5,060,180 issued Oct. 22, 1991 for "Programmable Digital Loop Filter" by Samuel C. Kingston et al; U.S. Pat. No. 5,128,958 issued Jul. 7, 1992 for "Digital Time Error Signal Generator" by Samuel C. Kingston et al; and U.S. Pat. No. 5,099,494 issued Mar. 24, 1992 for "Six Channel Digital Demodulator" by Samuel C. Kingston et al, each of which are hereby incorporated by reference herein. Each of the three above-identified Kingston et al patents refers to or includes a clock error signal Es for controlling a clock synthesizer. Kingston et al '180 shows a clock synthesizer 77 in its FIG. 2. Kingston et al '958 shows a clock synthesizer 76 in its FIG. 2. Kingston et al '494 refers to a clock synthesizer at column 3, line 48.

In Kingston et al '180, a programmable second order loop filter is provided with first and second programmable scaling circuits arranged in parallel and having their outputs connected to first and second programmable one bit serial adders respectively. The output of the second programmable serial adder is coupled to the input of the first programmable serial adder and has its output coupled to the input of a programmable output stage so as to provide the ability to maintain the average quantization bit error to one-half of one bit of the least significant bit of the full loop filter width even though the output does not use or employ all of the significant bits. FIG. 2 of the Kingston et al '180 patent shows a phase-locked loop employing a clock synthesizer 77 and passing through receiver stages 10, demodulator 54, line 55, switch 67, line 76, clock synthesizer 77, line 78, master clock or system clock 72, line 73, timing and control circuit 74 and line 53 applied to the clock input of receiver stages 10.

In Kingston et al '958, a time error signal generator of the type employed in symbol time tracking loops is provided with a pre-accumulate and scale circuit for receiving an input data stream which is applied to a digital early sample-late sample circuit for generation of an error signal indicative of a time magnitude difference between the analog transition time of the data and the chip strobe time multiplied by the sign of the data. The output of the early sample-late sample circuit is applied to a second accumulate and scale circuit for generating an accumulated error signal which is applied to an inverter. The inverter is provided with a decision directed tracking input indicative of the sign of the data sample and is employed to invert the accumulated error signal when the sign of the analog data is negative. The output of the inverter provides a digital time error tracking signal which is adapted to be coupled to a clock generation circuit or clock synthesizer for generating the tracking loop system clock as well as other strobe timing signals. Kingston et al '958 shows a phase-locked loop passing through its second order filter 74 and clock synthesizer 76, the latter producing the system clock 53 applied to components 51, 29 and 42.

Kingston et al '494 describes a six channel programmable digital demodulator of the type designed to be manufactured as an integrated circuit with other components. This demodulator comprises a code channel, a level channel and a phase channel, each of which includes two accumulate and scale circuits. Each of the accumulate and scale circuits is connected to an I or a Q channel of the data which has been despread after being received from the communications receiver. The outputs of two of the accumulate and scale circuits are applied to a two to one multiplexor which is controlled by a command generator to provide a selectable output defining a clock error signal. The remaining four accumulate and scale circuits are connected to a first four to one multiplexor to provide a selectable output defining a clock error signal. The same four remaining outputs from the accumulate and scale circuits are connected to a second four to one multiplexor having an output defining a carrier error signal.

SUMMARY OF THE INVENTION

Accordingly, an object of the present invention is to provide apparatus and method for providing a controllable variable-rate clock signal.

Another object of the present invention is to provide apparatus and method for timing recovery.

A further object of the present invention is to provide apparatus and method for providing a variable-rate clock for timing recovery such as in direct-sequence spread spectrum and other communication systems.

Still another object of the present invention is to provide apparatus and method for producing a controllable variable-rate clock signal that is a completely digital implementation, thereby reducing cost and size over an analog implementation and particularly permitting monolithic or ASIC or single-chip integration of a timing recovery system incorporating such apparatus or method.

Briefly, these and other objects of the present invention are accomplished by a combination of a signal processor and a divide-by counter to provide a controllably variable clock signal. The signal processor (which is preferably a state machined) is responsive to a control signal indicating whether the period of the clock signal then being produced should be increased, decreased or held. In response to that signal, the signal processor produces a count signal whose count value is correspondingly one greater than, one less than, or equal to the number of clock periods or pulses to be used in a predetermined portion of the number of output clock cycles or pulses needed to produce one bit or other data symbol. For example, the baseline value used could be the number of clock periods or pulses needed for one chip or other portion of a data symbol. The signal processor so produces the count signal each time that it receives a synchronization signal indicating the beginning of a new bit or other data symbol. The counter receives a constant clock signal and divides that signal by the value of the count signal to produce the output clock. After the counter has done so for a predetermined number of chip times or other portions of a bit or symbol time, it provides a signal to reset the signal processor until the next synchronization signal. This arrangement can be incorporated into a phase-locked loop or other control loop, with the control signal to the signal processor being provided by the loop filter.

Also, the foregoing and other objects of the present invention are accomplished by the data chip rate following method for producing a controllably variable clock signal. The clock signal is checked against a predetermined fixed standard clock to provide a digital error signal Es similar to that produced by the loop filter of a phase-locked loop. The digital error signal Es is use as a control signal for generating the variable clock frequency which is increased, decreased or held the same. In response to that control signal, the first chip or other portion of each data symbol is given a duration of N−1, N or N+1 reference clocks, where N is the number of sample clocks for the remaining chips or other portions of that data symbol. Remaining chips or other such portions of that data symbol continue to have a duration of N sample clocks.

Other objects, advantages and novel features of the invention will become apparent from the following detailed description of the invention when considered in conjunction with the accompanying drawings.

DESCRIPTION OF THE PREFERRED EMBODIMENT

Figure 1:
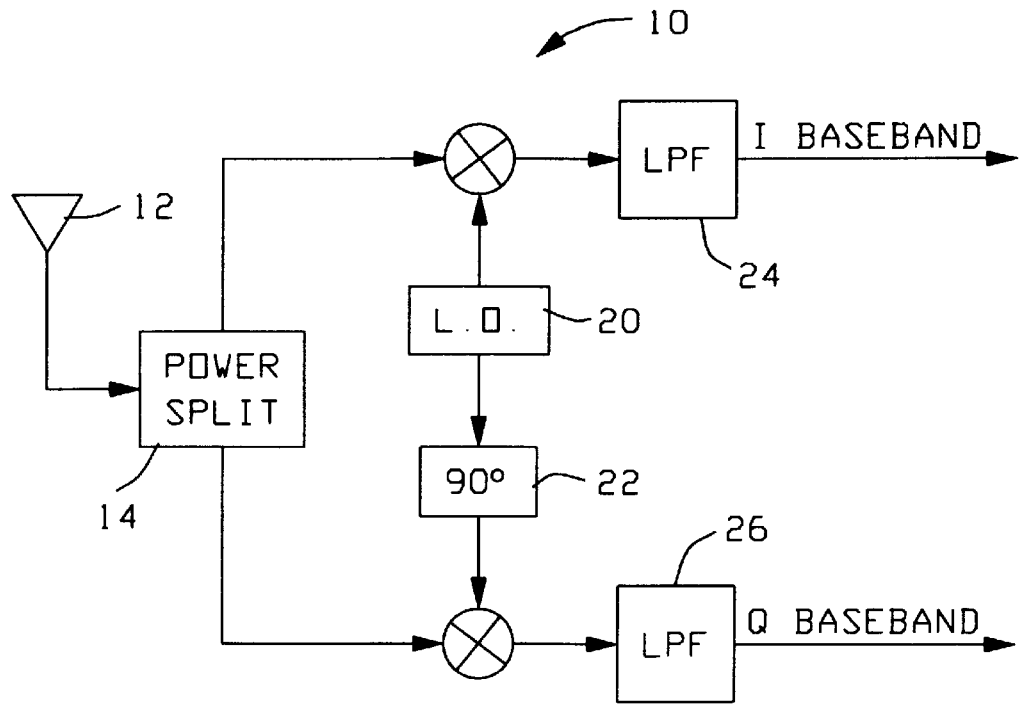
FIG. 1 is a block diagram of pre-processing circuitry of a communications receiver.

Referring now to the drawings, wherein like reference characters designate like or corresponding parts throughout the several views, there is shown in FIG. 1 a prior art analog front portion or preprocessing portion 10 of a digital sample data communications receiver. Radio frequency signals received by antenna 12 are provided (with or without preamplification) to power splitter 14. Power splitter 14 applies the received signal to mixers or multipliers 16 and 18. Mixer or multiplier 16 mixes or multiplies the radio frequency signal applied thereto from power splitter 14 with the output of a local oscillator 20. The output of local oscillator 20 is also provided to a phase shifter or other device 22 which changes the phase of the received local oscillator 20 output by 90 degrees. Mixer or multiplier 18 combines the other output of power splitter 14 with the output of phase shifter or other device 22. The signal produced by mixer or multiplier 16 is then passed through a low pass filter 24 to produce an I (in-phase) baseband signal. The output of mixer or multiplier 18 is provided to low pass filter 26 which produces a Q (quadrature) baseband signal.

Figure 2:
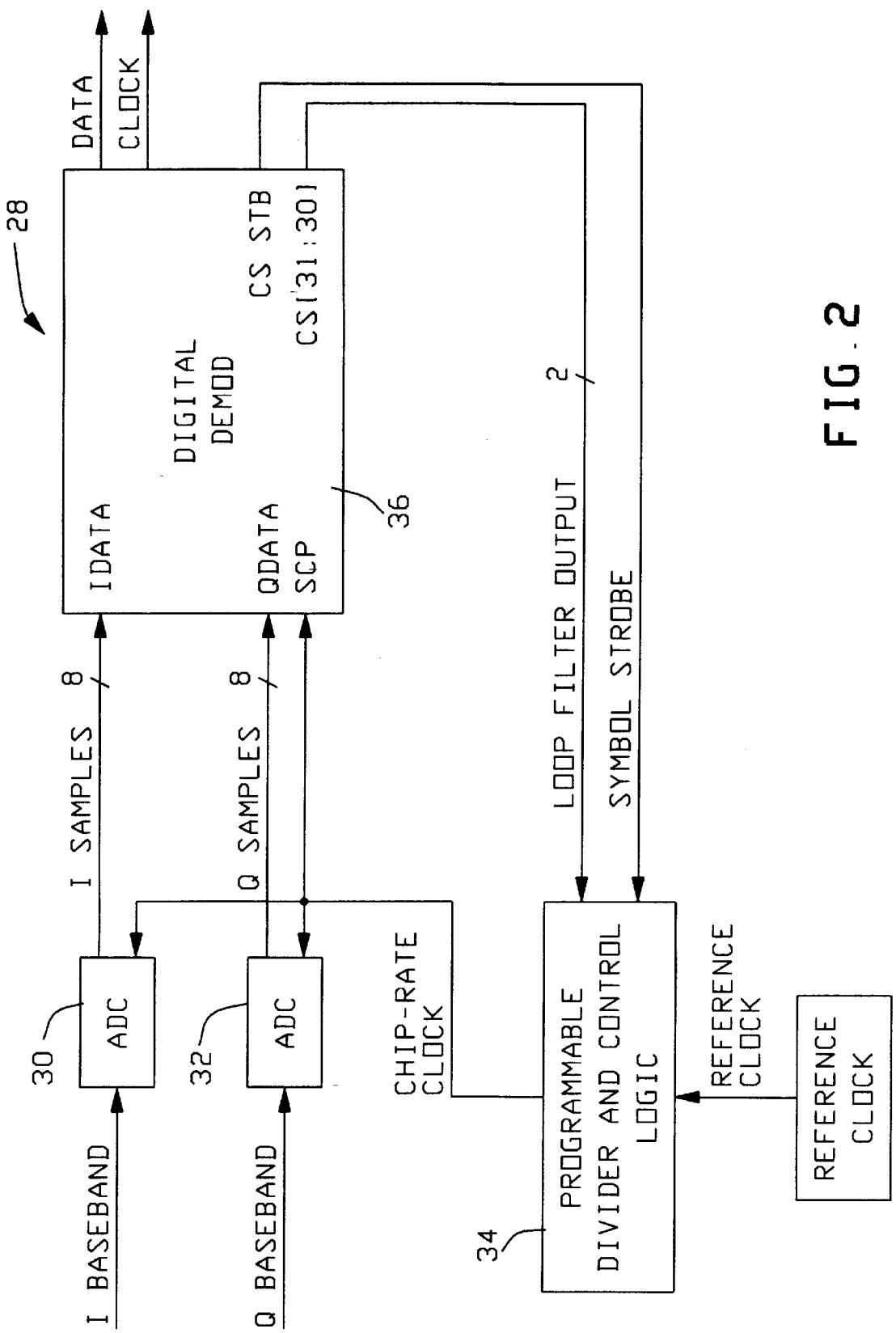
FIG. 2 is a block diagram of a demodulation system, according to an embodiment of the present invention, receiving signals produced by the system of FIG. 1.

The I and Q baseband analog signals of FIG. 1 are provided to system 28 of FIG. 2. Portion 10 and system 28 together constitute a digital communications receiver. In FIG. 2, the I baseband signal is provided to analog-to-digital converter 30, while the Q baseband signal is provided to analog-to-digital converter 32. Programmable divider and control logic 34 produces a chip-rate clock signal which is applied as the sampling clock to clock the converter 30 and the converter 32. In response, converter 30 produces eight bit digital samples of the I signal, and converter 32 produces digital samples of the Q baseband signal. The I samples from converter 30, the Q samples from converter 32 and the chip-rate clock from programmable divider and control logic 34 are all provided to digital demodulator and loop filter 36. Digital demodulator 36 produces a data signal showing the data transmitted via the RF signal received by antenna 12. Digital demodulator 36 also produces a clock signal that is synchronized with the digital data signal produced by the demodulator. Digital demodulator 36 furthermore serves as the loop filter for a phase-locked loop including digital demodulator 36 and programmable divider and control logic 34. For this purpose, digital demodulator 36 also produces a loop filter output signal indicative of whether the period of the chip-rate clock should be increased, decreased or held the same. For example, if the loop filter output signal is a two bit digital signal, then a value of 00 could indicate hold the period the same, a value of 01 could indicate that the period should be reduced, and a value of 11 could indicate that the period should be increased. Digital demodulator 36 also produces a symbol strobe signal on line 37 indicating when a new bit or other data symbol is to be obtained from converter 30 and converter 32. The loop filter output signal Es and the symbol strobe signal from digital demodulator 36, and a reference clock signal, are provided to programmable divider and control logic 34, which produces a plurality of the chip-rate clock signal each bit strobe time thereon. As produced by converter 30 and converter 32, each data symbol is subdivided into a number M of (such as 100) chips. For each data symbol, except for the first chip, each chip of each data symbol has a duration of N reference clocks, i.e. N reference clock pulses or periods. However, the first chip of each data symbol may have a duration of N-1, N or N+1 reference clock output signal Es.

As shown in FIG. 2, system 28 uses the timing error signal produced by a digital demodulator or digital loop filter as described in any of the above-identified patents to Kingston et al. For the present embodiment, the timing error signal is updated at the symbol rate, that is at the same rate that the data symbols are produced. Instead of requiring a large number of bits (such as 32) to control a high resolution digital data synthesizer circuit, system 28 considers the lower 30 bits of such a timing error signal to be continuously accumulated internal to the loop filter, and that only the upper two bits are used to control the programmable divider 34. As shown in FIG. 2, a reference clock 33 is provided that is N times faster than the chipping rate. The programmable divider 34 normally divides the reference clock by N (typically, N=8). However, once each symbol time, the programmable divider divides the reference clock by N, N−1 or N+1, depending on whether the period of the chip-rate clock signal is to be held the same, decreased or increased. Since the programmable divider 34 is here only modified once per symbol, fine timing accuracy can be achieved, even for a ramp input to the timing loop formed by demodulator 36 and programmable divider and control logic 34, the worst-case frequency error is given by the following expression:

$$\text{freq\_error} = \pm(0.5/(N \times PG)) \times 10^6 \text{ ppm}$$

where

PG is the ratio of the chipping rate to the symbol rate

N is the ratio of the reference clock to the chipping rate (typically N=8).

Figure 3:
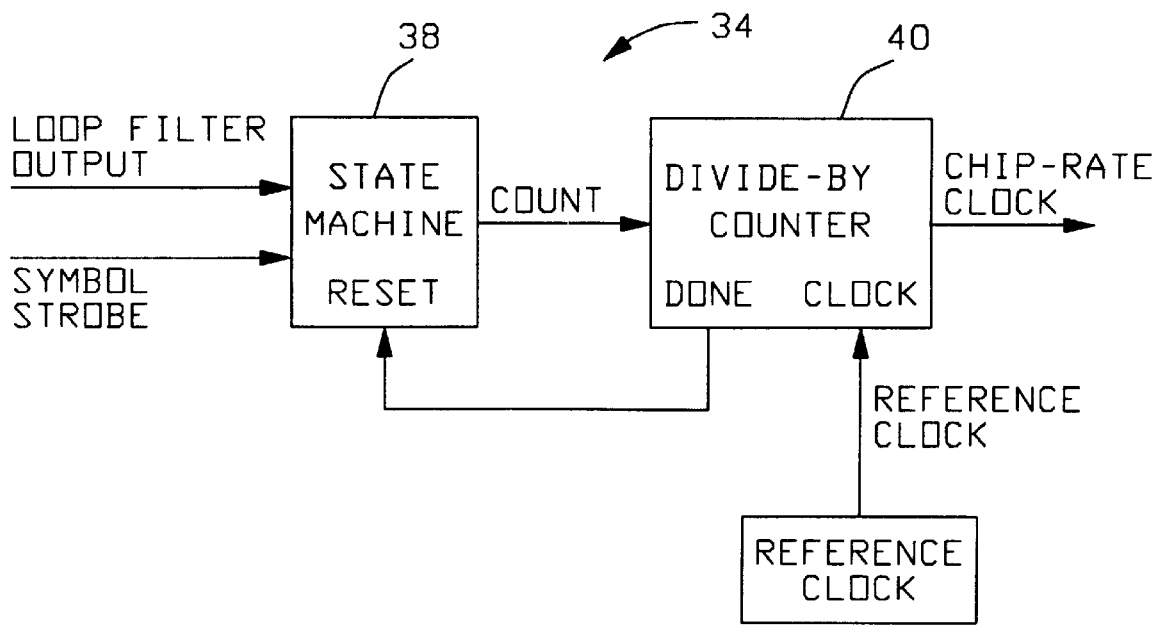
FIG. 3 is a block diagram of a portion of the system of FIG. 2 shown in greater detail according to an embodiment of the present invention.

Programmable divider and control logic 34 of FIG. 2 is shown in greater detail in FIG. 3. As shown in FIG. 3, programmable divider and control logic 34 includes state machine 38 and divide-by counter 40. State machine 38 receives the loop filter output signal and symbol strobe signal produced by digital demodulator 36. In response to those signals, state machine 38 produces a count signal which is then provided to divide-by counter 40. Such operation of state machine 38, and the relationship among certain values of the loop filter output signal, the symbol strobe signal and the count signal, are shown in the state or flow diagram of FIG. 4. Occurrence on the symbol strobe line of an appropriate timing or synchronizing pulse, indicating the commencement of a new data symbol, causes enablement of state machine 38 to produce a count signal having a value of N, N−1 or N+1; otherwise, state machine 38 defaults to producing a count signal having a value of N until the next symbol strobe. The count signal can have a value of N, N−1 or N+1. Counter 40 receives both the reference clock signal and the count signal, and divides the reference clock signal by the value (N, N−1 or N+1) of the count signal. The chip rate clock signal is the resulting divided signal produced by counter 40. Digital divide-by counter 40 can for example be a down counter with a parallel load that would produce a signal at its "DONE" output whenever a divide-by operation had been completed. This signal would then be used to reset state machine 38 so that the count signal will have a value of N for the rest of that data symbol, until the next symbol strobe occurs. The divided reference clock signal produced by the counter 40 is the chip rate clock signal that is provided to converters 30 and 32 of FIG. 2.

Figure 4:
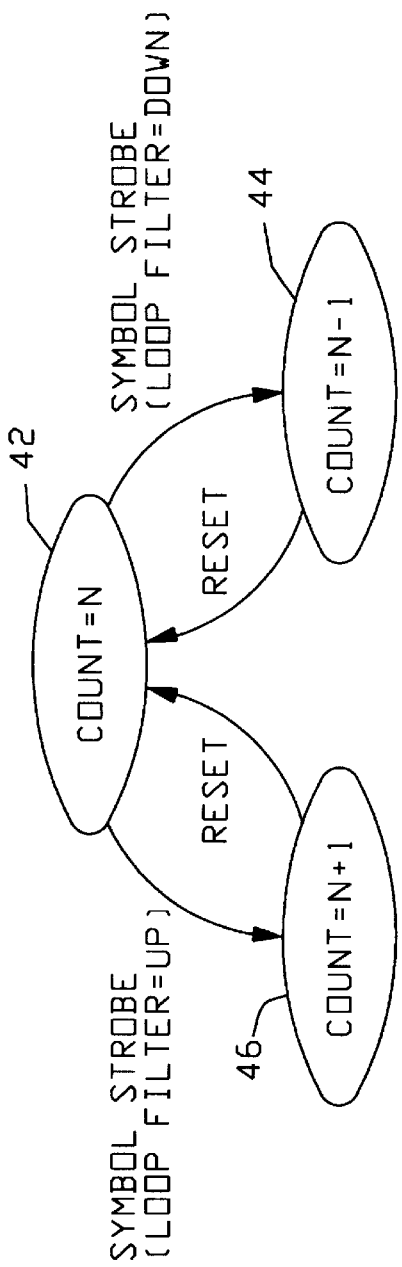
FIG. 4 is a state or flow diagram for a state machine according to an embodiment of the present invention shown in FIG. 3.

As shown in FIG. 4, state machine 38 has three possible states, respectively defined by the three possible values N, N−1 and N+1 of the count signal. These three states are shown in FIG. 4 as states 42, 44 and 46, respectively. State machine 38 will only leave the count=N state 42 when a symbol strobe occurs and the loop filter output signal value is representative of other than a hold, i.e. up or down. State machine 38 will go from state 42 to the count=N−1, state 44 only when a symbol strobe occurs and the loop filter output signal indicates that the chip-rate clock frequency should be decreased. Once in the state 44, state machine 38 will return to state 42 when it receives a reset signal from counter 40, and will thereafter remain in state 42 at least until occurrence of the next symbol strobe. State machine 38 will enter the count=N+1 state 46 only upon the occurrence of a symbol strobe and a loop filter output signal value indicating that the chip-rate clock period should be increased. If that occurs, then state machine 38 will remain in the state 46 until occurrence of a reset signal from counter 40. As discussed above, the reset signal occurs when counter 40 has completed a divide-by operation for a single chip. Thus, state machine 38 will leave state 42 for only one chip per symbol.

Figure 6:
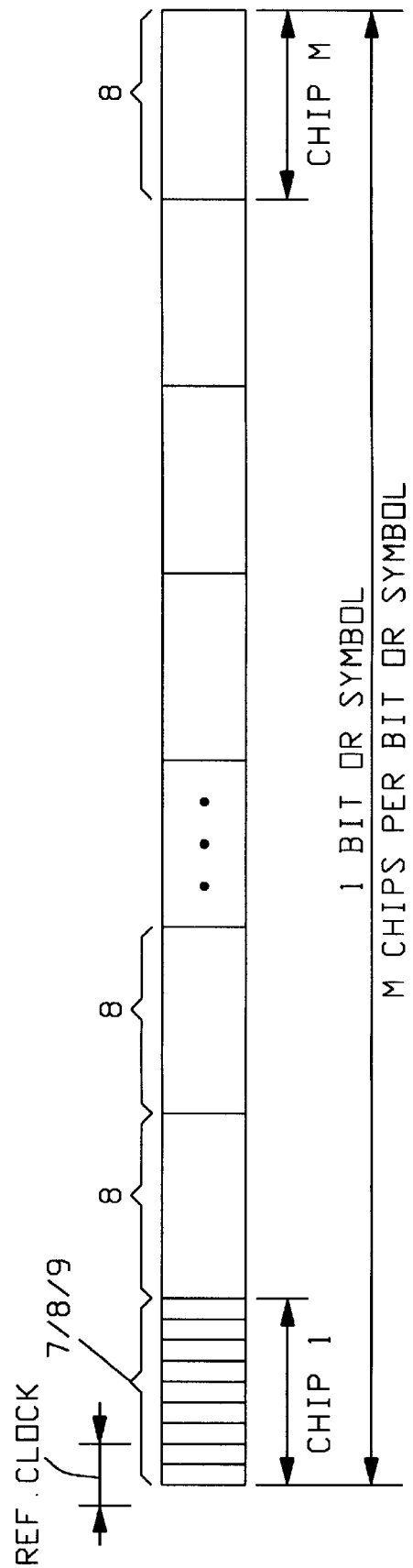
FIG. 6 is a waveform timing diagram showing clock timing structure for any one of the bits of FIG. 5.
Figure 5:
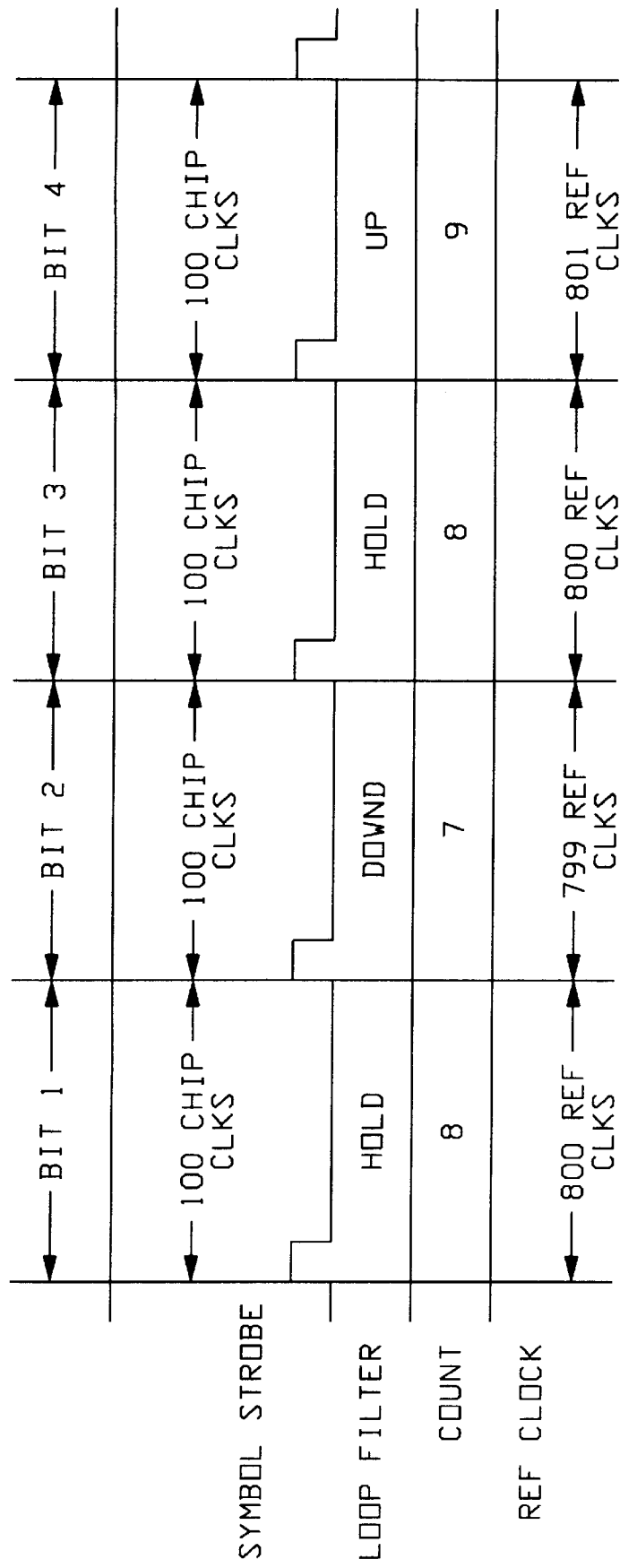
FIG. 5 is a waveform timing diagram showing illustrative timing for four consecutive illustrative bits in accordance with an embodiment of the present invention.
Figure 7:
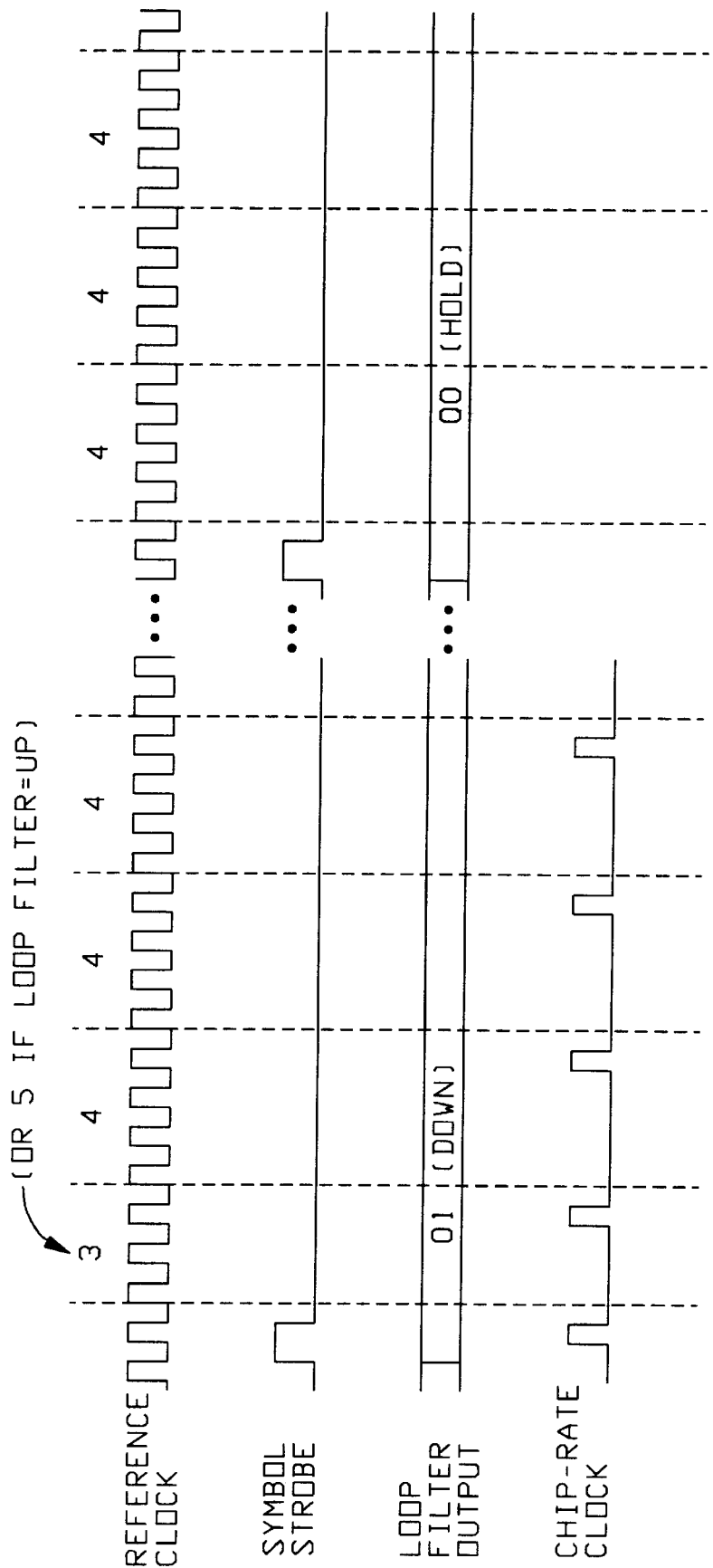
FIG. 7 shows, in greater detail, an example of clock timing structure for respective portions of two different bits or other data symbols in accordance with another embodiment of the present invention.

One example of operation of the system of FIGS. 2–4 is shown in FIGS. 5 and 6. Another example is shown in FIG. 7. For FIGS. 5 and 6, N=8; for FIG. 7, N=4. FIG. 5 shows corresponding waveforms or values for various signals of the system of FIGS. 2–4 for four consecutive illustrative bits. The first line of FIG. 5, and the vertical lines, identify and demarcate the four bits. The second line shows that in each case, each bit is transmitted as 100 chips. The third line shows occurrence of the symbol strobe at the beginning of each bit; this means that the first chip in each bit will be modified if there is a need to change the chip rate clock phase or period. The fourth line of FIG. 5 shows the indication then provided by the loop filter output for that symbol strobe; also, the loop filter output signal value may so indicate prior to as well as during the symbol strobe. The fifth line of FIG. 5 shows the corresponding count signal value resulting from that loop filter output signal indication. The last line of FIG. 5 shows how many reference clock signal periods or pulses are therefore required for each bit. As shown in FIG. 5, a down indication from the loop filter output signal results in 799 reference clock periods or pulses being generated for bit 2. 800 reference clock periods or pulses are generated for bit 1 and for bit 3, for which the loop filter output signal indication is hold. 801 reference clock periods or pulses are needed for generation of bit 4, which has 100 chips of which the first chip is nine clock periods or pulses long and the other 99 chips are each N=8 clock periods long. Thus, a relatively fine adjustment can be provided.

FIG. 6 shows in greater detail what happens during any one bit or symbol such as of FIG. 5. The bit of FIG. 6 is made up of M chips, where M can for example equal 100. The first chip requires 7, 8 or 9 reference clock periods or pulses, while chips 2 through M each require N=8 reference clocks. The count signal determines the number of reference clocks for the first chip.

FIG. 5 shows a sequence of 4 bits with for example 100 chips per bit. The symbol strobe shows where the bit or other symbol starts. The loop filter signal and the reference clock signal shown in FIG. 5 respectively refer to the loop filter output signal and the reference clock signal of FIGS. 2 and 3. The loop filter output signal is provided to programmable divider and control logic 34 from the digital demodulator 36. The first chip of each data symbol has duration of N−1, N, or N+1 reference clocks, depending on loop filter output. The loop filter output signal thus informs programmable divider and control logic 34 whether there should be N−1, N or N+1 reference clocks in the first chip of each data symbol; thus, three different commands can be provided by the loop filter output signal. As shown in FIG. 5, these commands can be hold, down or up. In FIG. 5, a hold command from the loop filter output results in N=8 reference clocks per chip for the first chip. A down command from the loop filter output results in N=7 reference clocks per chip for the first chip. An up command from the loop filter output results in N+1=9 reference clocks per chip for the first chip, if N equals 8. In FIG. 6, the variable nature of the first chip of a bit is shown on the left side, where chip 1 is represented as having 7, 8 or 9 reference clocks. FIG. 6 together shows one bit or other data symbol; a single chip is contained within one brace. For M chips per bit or other symbol, if M=100 then there would be 100 chips per bit for this example, as is also shown in FIG. 5. FIG. 6 further breaks down a single bit such as of FIG. 5 so that several of the chips are shown in FIG. 6 and each chip of that bit is shown to have 8 reference clocks except for the very first chip. The very first chip on the far left end of FIG. 6 is the chip that can be 7, 8 or 9 reference clocks long. Thus, in the present example, it is only the initial chip per bit that the command of the loop filter output signal would apply to in FIGS. 5 and 6; the other chips 2 through M would then always have N reference clocks per chip. Thus, where the chip on the far right end of FIG. 6 is chip M, chips 2 through M will each have 8 reference clocks, while chip 1 will have either 7, 8 or 9 reference clocks. The count signal specifies how many reference clocks are included in the first chip, and the loop filter output signal determines what the count signal will be. In FIG. 5, the last line shows the number of reference clocks per bit based on what command is provided by the loop filter output signal. For bit 1, there is a command of hold, so that there would be 8 reference clocks in the first chip; with 100 chips, 8 times 100 gives 800 reference clocks per bit for bit 1 of FIG. 5. In bit 2 of FIG. 5, the loop filter output command is down, resulting in a count signal providing for 7 reference clocks for the first chip, so that bit 2 uses a total number of reference clocks that is one less than that of bit 1, i.e. 799. For bit 3, the loop filter output command is hold, so that the first chip of bit 3 has 8 reference clocks and bit 3 has a total of 800 reference clocks. For bit 4, the loop filter output command is up, so that the first chip of bit 4, and thus bit 4 overall, has an extra reference clock, for a total of 801 reference clocks for bit 4.

FIG. 3 shows a state machine 38 having two inputs, a data input receiving the loop filter output signal and a clock or trigger or synchronizing input receiving the symbol strobe signal. The loop filter output signal is generated by the phase locked loop of FIG. 2 where the determination is made that there is a need to speed up the frequency (decrease the period) of the sampling clock, slow that clock down (increase its period) or keep that clock the way it presently is; that determination is made at the end of each bit or other data symbol. This determination can be made by a phase locked loop other than that shown in FIG. 2. In other words, in every phase locked loop there is a comparison that is made involving the sampling of the input signal coming in, where the loop is trying to lock onto that signal. Such a loop is intended to generate an internal clock that is in phase with that incoming signal. For this purpose, samples are taken of the incoming signal, and at the end of each bit or other data symbol of that signal the loop looks at the result of those samples and makes a determination that there is a need to speed up the rate of sampling, slow down the rate of sampling or that the loop is already locked. This could be accomplished by any conventional phase-locked loop. Such a phase locked loop generates some signal representing whether the frequency has to be speeded up or slowed down in order to get locked on to the incoming signal; once the phase gets locked on, then a hold command would be appropriate, indicating that the frequency should remain the way it is. When programmable divider and control logic 34 receives this signal that says to speed up or slow down or hold, the chip-rate clock is then speeded up or slowed down or held in response to that signal. This is accomplished by programmable divider and control logic 34, shown in greater detail in FIGS. 3 and 4.

Digital demodulator and loop filter 36 generates a loop filter output signal representing one of three commands. In response to that loop filter output signal, the state machine 38 generates a count signal representative of N−1 or N+1 or N. That count signal is provided to digital counter 40, which also receives the reference clock signal and divides the reference clock signal by N−1 or N+1 or N, depending on the value of the count signal, to generate the chip-rate clock signal. Digital counter 40 generates a clock signal which will contain either N−1 reference clocks. N+1 reference clocks or N reference clocks, depending on whether a down, up or hold command appears as the loop filter output signal, but only for the chip defined by the symbol strobe, which is here the first chip of a bit or other data symbol. As shown in FIGS. 5 and 6, counter 40 generates the next M−1 chip clocks for that data symbol (where M is the number of chips making up that data symbol) with N reference clocks per chip. FIGS. 5 and 6 show N=8, while FIG. 7 shows N=4. The result of this activity by counter 40 is to shift the chip-rate clock by just a very small amount. For the example shown in FIGS. 5 and 6, where N=8 and M=100, 799 or 800 or 801 reference clocks per bit can be generated. The example of FIG. 7 is coarser, where 399 or 400 or 401 reference clocks would be generated per bit, assuming that M=100 chips per bit. In other words, as shown in FIGS. 5 and 7, there would be only a two reference clock difference between any two bits, at most. Thus, very fine tuning is provided within a bit time. This fine tuning is provided here because only one chip per bit is so affected. Coarser tuning can be provided by decreasing the value of N, decreasing the value of M, or affecting more than one chip per bit.

Thus, the system of FIGS. 2–4 takes a digital error signal, which says to speed up or slow down or stay the same, and from that generates the chip rate clock which is also a digital signal. This has been accomplished without, as an intermediate step, generating any analog signals. FIG. 3 shows a digital state machine 38, and a digital counter 40 which will selectively count by either N, N−1 or N+1 depending on the value of the count signal from the state machine. Both of these are digital components. Thus, a completely digital implementation has been provided. Therefore, the circuitry needed can be completely integrated and can be placed on a single integrated circuit chip, if desired. Because the system of FIGS. 2–4 is all digital, the total amount of circuitry can be greatly reduced than would be the case if analog circuitry was also used.

FIG. 7 shows one example of signals of FIG. 2 for two illustrative adjacent bits where N=4. The first line of FIG. 7 shows a reference clock where N=4. As shown in FIG. 7, four reference clock periods would be needed for the first chip of a bit in response to a hold command. Three reference clocks would then be needed for the first chip of a bit in response to a down command. Five reference clock periods would be needed for the first chip of a bit in response to an up command to state machine 38. The second line of FIG. 7 shows the symbol strobe, which defines the immediately following chip as the first chip of a bit. The third line of FIG. 7 in part represents the loop filter output signal, which here is a digital signal of 01 for down, 00 for hold, or 11 for up. The fourth line of FIG. 7 shows the resulting chip rate clock. Again, the loop filter output will determine whether the chip identified by the symbol strobe will be 3, 4 or 5 reference clock periods long, and thus makes a small adjustment in the period (and frequency) of the chip rate clock if and as needed.

Figure 8:
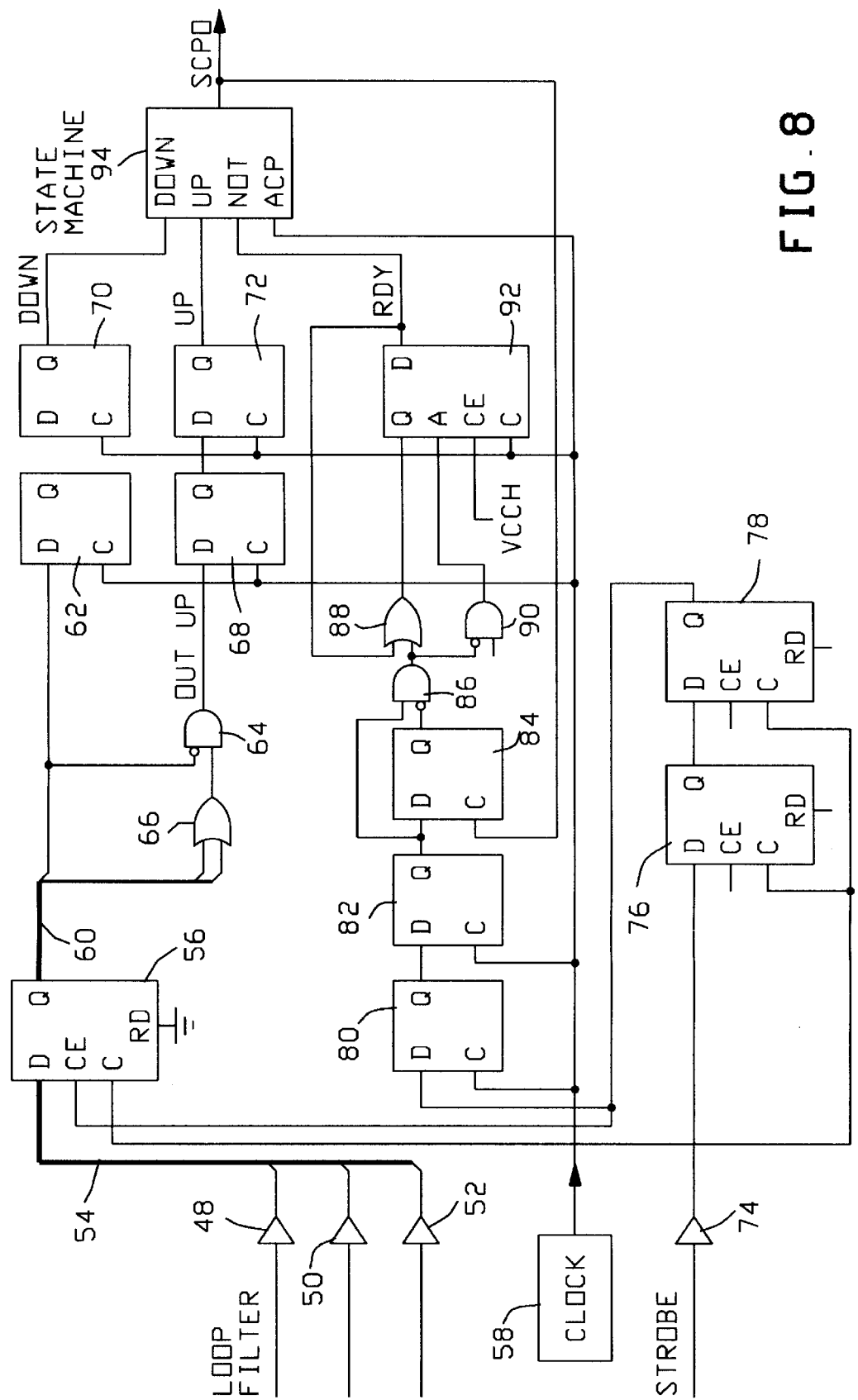
FIG. 8 is a block diagram showing one example of a digital implementation of a portion of the system of FIG. 2 according to an embodiment of the present invention.
Figure 9:
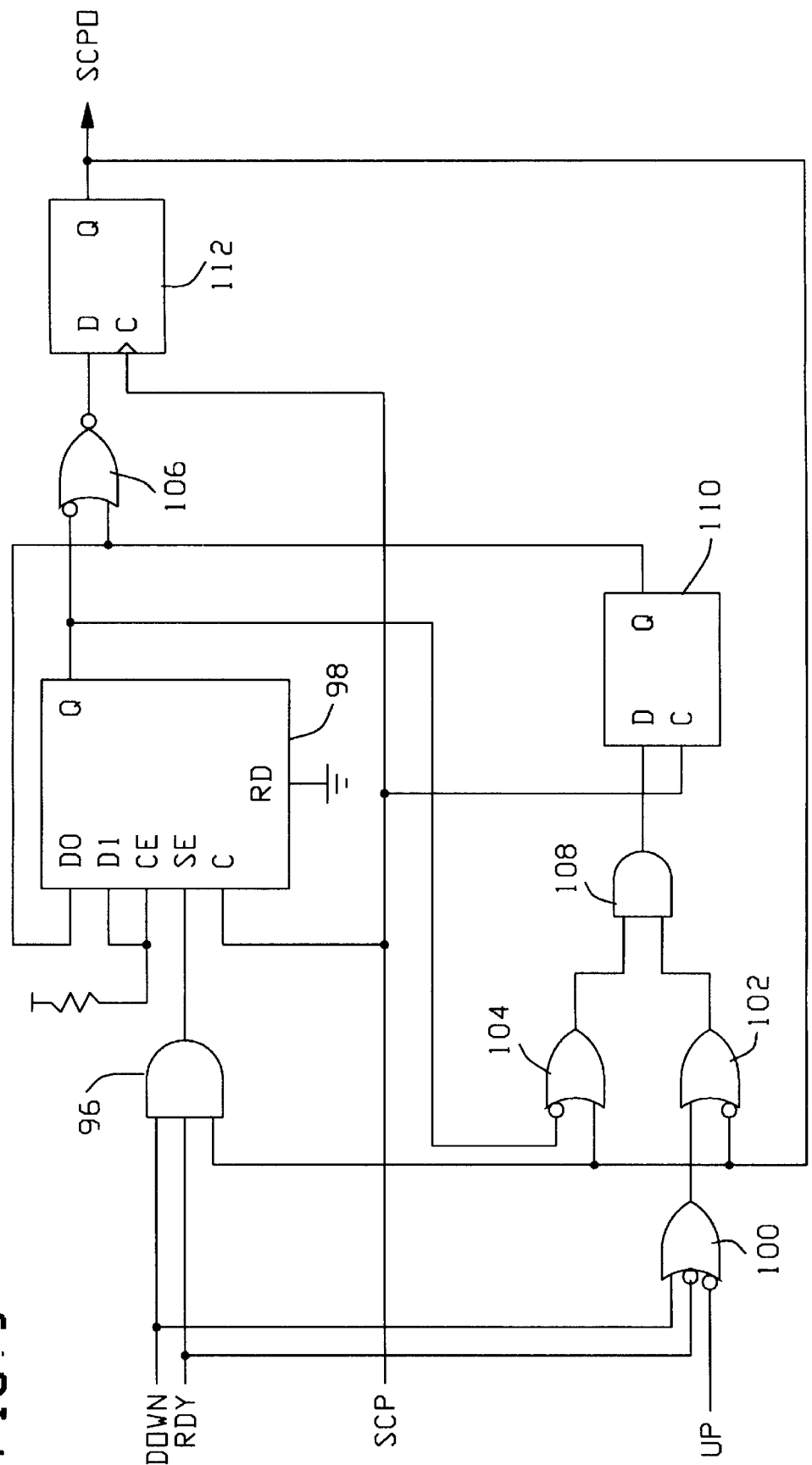
FIG. 9 is one example of a digital implementation of a portion of the system of FIG. 8 according to an embodiment of the present invention.

FIGS. 8 and 9 together show one digital implementation of the system of FIG. 3. For the implementation of FIGS. 8 and 9, the loop filter output signal has 3 bits instead of 2 bits, and N =4. The three bit frequency command appears on lines CLK_SYNTH_29–31. Each of the those three lines passes through a respective inverting buffer IBUF 48, 50 or 52. The resulting buffered signals CS29, CS30 and CS31 are then placed on a parallel bus 54 and are provided thereby to the data (D) input of data-type (D-type) flipflop 56. The other inputs to flipflop 56 are clear (CE) and clock (C). All clocked components of FIG. 8, and thus all clocked components of FIG. 9, have a common clock 58. The D input, and the Q output, of flipflop 56 are both 8 bits parallel wide, although only the three most significant bits of each are actually utilized for this purpose. The most significant bit (bit 7) of the Q output of flipflop 56 is provided via a bus 60 to the data input of D-type flipflop 62, and is provided to an inverting input of AND gate 64. The next two most significant bits (bits 6 and 5) are ORed together by OR gate 66. The output of OR gate 66 is provided to the other, non-inverting input of AND gate 64. The output of AND gate 64 is provided to the D input of D-type flipflop 68. The Q output of flipflop 62 is provided to the D input of D-type flipflop 70. The Q output of flipflop 68 is provided to the data (D) input of D-type flipflop 72. As is also indicated in FIG. 2, the symbol strobe appears at the CS_STB output of digital demodulator and loop filter 36, and appears on the correspondingly identified input line of FIG. 8. The strobe is passed through inverting buffer 74, whose output is provided to the data (D) input of D-type flipflop 76. The Q output of flipflop 76 is provided to the D input of the D-type flipflop 78. Thus, flipflops 76 and 78 in effect apply a fixed delay to the strobe signal. The Q output of flipflop 78 is applied to the clear input of flipflop 56 and to the data input of D-type flipflop 80. The Q output of flipflop 80 is connected to the D output of D-type flipflop 82. The Q output of flipflop 82 is provided to the D input of D-type flipflop 84 and to the non-inverting input of AND gate 86. The Q output of flipflop 84 is provided to the other, inverting input of AND gate 86. The output of AND gate 86 is provided to an input of OR gate 88 and to the inverting input of AND gate 90. The output of OR gate 88 is provided to the D input of flipflop 92. The output of AND gate 90 is provided to the R input of flipflop 92. The clear input of flipflop 92 is held high and thus off The Q output of flipflop 92 is provided to the other input of OR gate 88 and to the ready (RDY) input of state machine 94. The Q output of flipflop 70, which indicates whether a down command has been received, is provided to the DOWN input of state machine 94. The Q output of flipflop 72, which indicates whether an up command has been received, is supplied to the UP input of state machine 94. The clock signal from clock generator 58 is applied to the SCP input of state machine 94, and to the C or clock input of flipflops 56, 62, 68, 70, 72, 76, 78, 80, 82, 84, and 92. The output SCPO of state machine 94 is provided to the non-inverting input of AND gate 90 and to counter 40 shown in FIG. 3. Thus, it will be understood that the three bit signal on line 35 may be employed as separate inputs shown on lines 29–31 in FIG. 8 to produce the down, up, not and SCP clock signals shown as inputs to state machine 94 to produce the desired count signal on line 39 (also shown on FIG. 3). The count produced has been described graphically with reference to FIGS. 5 and 6.

State machine 94 of FIG. 8 is shown in greater detail in FIG. 9. The DOWN and RDY inputs are provided to respective inputs of 3-input AND gate 96. The output of AND gate 96 is provided to the SE input of flipflop 98.

Although flipflop 98 is indicated as being a dual-input flipflop, both input D1 and the Clear Enable input CE are held high and are thereby disabled. The DOWN signal from flipflop 70 is also provided to the non-inverting input of OR gate 100. The RDY signal from flipflop 92 is provided to an inverting input of OR gate 100. The UP input signal from flipflop 72 is provided to the other inverting input of OR gate 100. The output of OR gate 100 is provided to the non-inverting input of OR gate 102. The Q output of flipflop 98 is provided to the inverting input of OR gate 104 and to the inverting input of OR gate 106. The output of OR gate 102 is provided to one input of AND gate 108. The output of OR gate 104 is provided to the other input of AND gate 108. The output of AND gate 108 is provided to the D input of D-type flipflop 110. The Q output of flipflop 110 is provided to the other, non-inverting input of NOR gate 106 and to the DO data input of flipflop 98. The output of NOR gate 106 is provided to the D input of the D-type flipflop 112. The clock signal from clock 58, appearing at the SCP input of state machine 94, is applied to the respective clock (C) inputs of flipflop 98, flipflop 110 and flipflop 112. The Q output of flipflop 112 is the SCPO output signal of state machine 94, and is also provided to the inverting input of OR gate 102, the non-inverting input of OR gate 104 and the third input of AND gate. Thus, it will be understood that the components or elements shown in FIG. 3, and shown in a preferred detailed embodiment may easily be included on chip with a P-100 demodulator in a manner that eliminates the need for off-chip synthesizers of the prior art type shown in FIG. 11 without the expense of redesigning a new digital demodulator chip.

Figure 10:
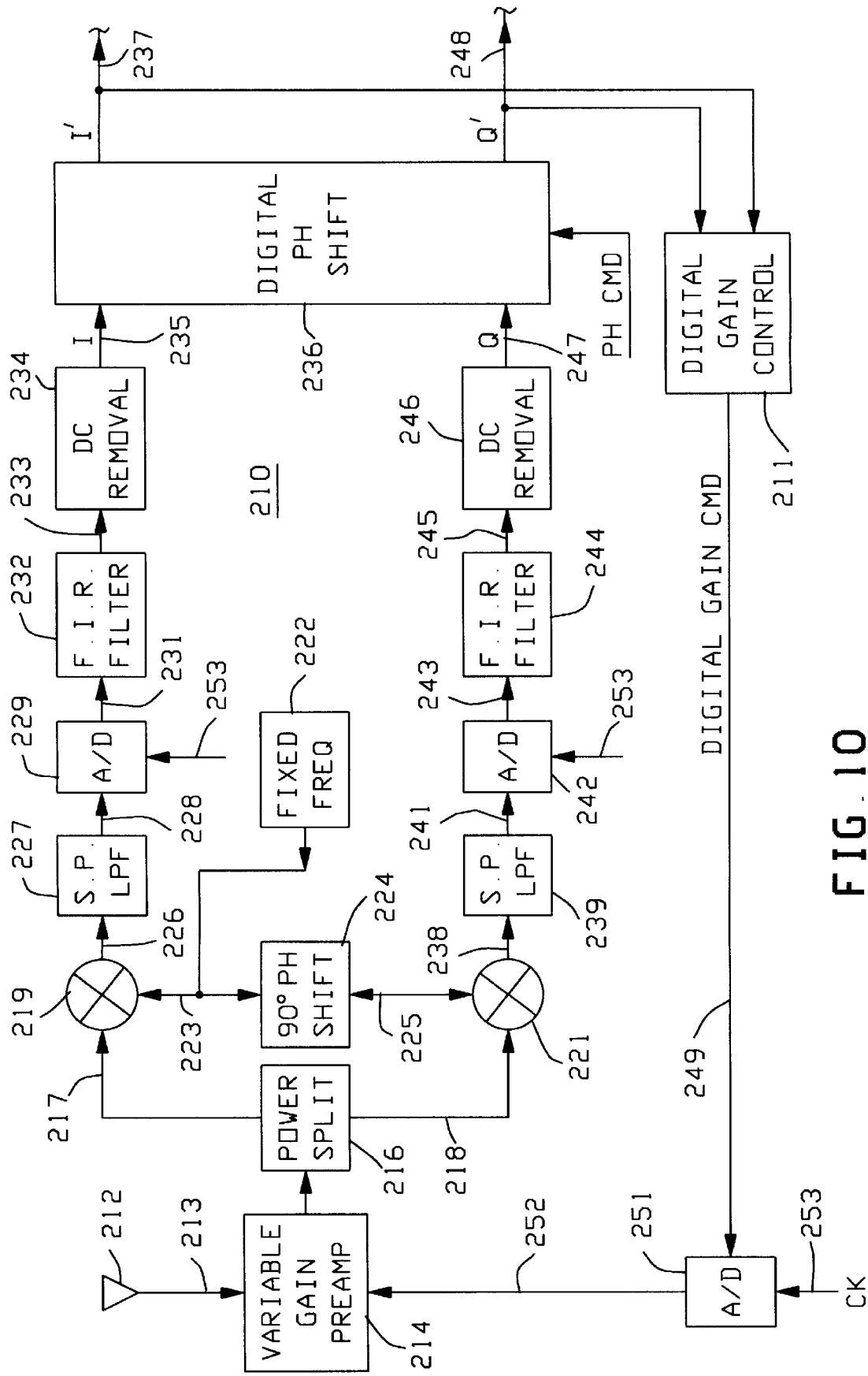
FIGS. 10 and 11 together show one example of a system in which the system of FIGS. 3 and 4 can be advantageously utilized, FIG. 10 being a schematic block diagram of a communications receiver pre-processing circuitry and FIG. 11 being a schematic block diagram of a communications receiver incorporating the FIG. 10 pre-processing circuitry.
Figure 11:
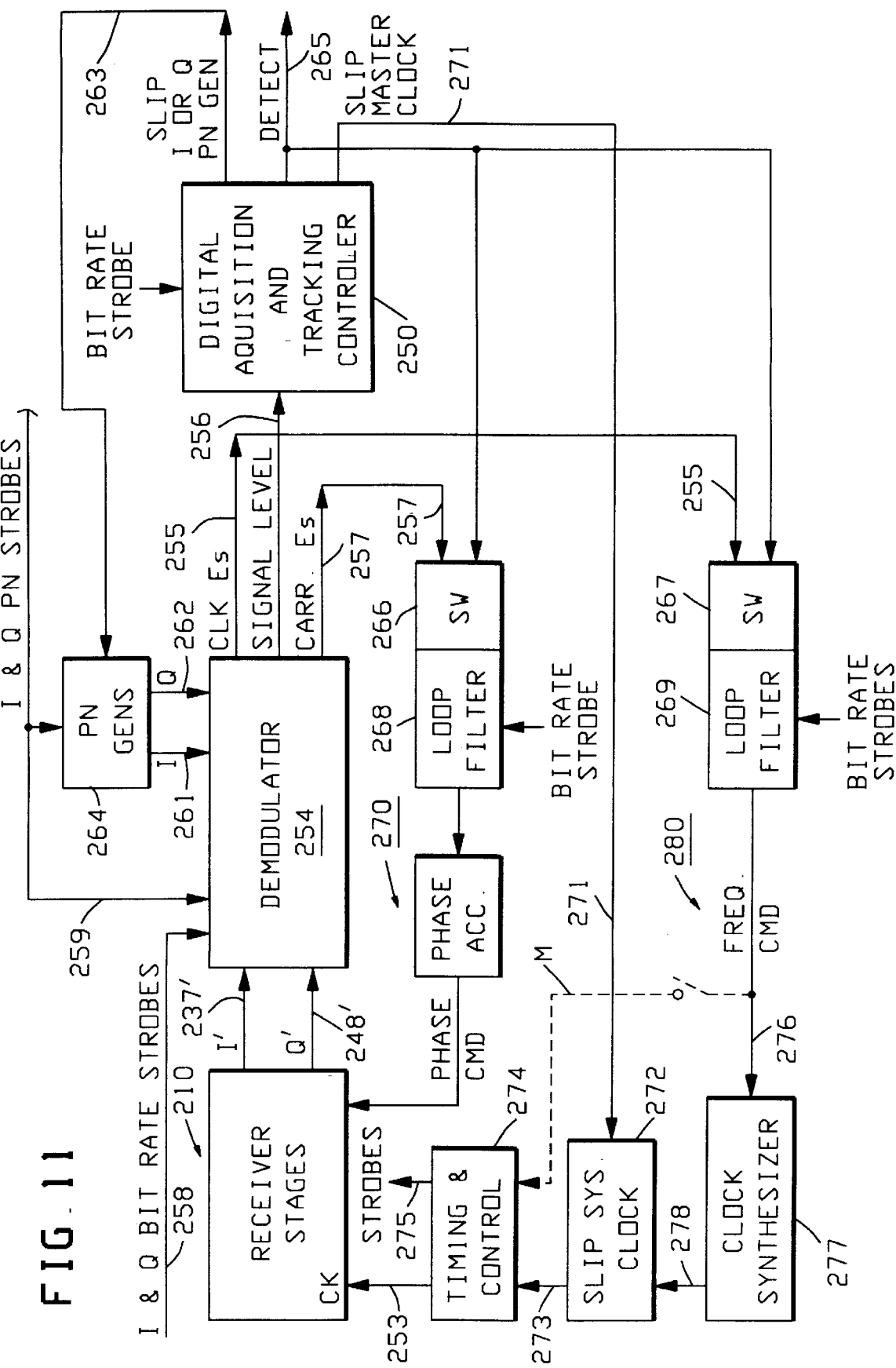

One example of a system in which the system of FIGS. 3 and 4 could be inserted is illustrated in FIGS. 10 and 11. FIGS. 10 and 11 are respectively adapted from FIGS. 1 and 2 of U.S. Pat. No. 5,060,180. FIG. 10 shows a programmable digital gain controller 211 connected to a data stream of a digital sample data communications receiver 210. The radio frequency (RF) signals received by the antenna 212 are coupled via line 213 as analog signals to a variable gain preamplifier 214 to provide a controlled level output signal on line 215 to power splitter 216. The RF analog signal on lines 217 and 218 are applied to a pair of mixers 219 and 221 connected to the real and imaginary channels I and Q respectively. A fixed frequency oscillator 222 has an output on line 223 which is connected to mixer 219 and to a 90 degree phase shifter 224 which provides a quadrature output on line 225 to mixer 221. The real analog RF signal on line 226 is applied to a single pole low pass filter 227 to provide a filtered analog output signal on line 228. The analog signal at the input of A to D converter 229 is converted to a digital output on line 231 which is applied to a finite impulse response (FIR) filter 232 to provide a filtered digital signal on line 233 which has some D.C. component that is removed by D.C. removal circuit 234 to provide the real digital signal on line 235. The real digital signal on line 235 is applied to a digital phase shifter 236 of the type described in U.S. Pat. No. 4,841,552 to provide a phase shifted signal on line 237 shown as I'. U.S. Pat. No. 4,841,552 issued Jun. 20, 1989 for Digital Phase Shifter by Samuel C. Kingston is hereby incorporated by reference herein.

In a manner similar to that described above, the output signal on line 238 in the imaginary channel Q is applied to a low pass filter 239 whose output on line 241 is applied to an A to D converter 242. The digital output on line 243 is applied to a filter 244 and the filtered output on line 245 is applied to a D.C. removal circuit 246 to provide the imaginary digital signal Q on line 247. The imaginary signal Q on line 247 is applied to the digital phase shifter 236 of the type described in U.S. Pat. No. 4,841,552 to provide the phase shifted imaginary signal Q' on line 248. The real and imaginary signals on lines 237 and 248 are connected to a digital gain controller 211 to provide a digital gain command on line 249 which is shown connected to digital to analog converter 251. The analog output on line 252 is connected to the analog variable gain preamplifier 214 to control the output signal on line 215 at a predetermined controlled level. When the variable gain preamplifier is provided with a digital input, the digital gain command on line 249 may be coupled directly to the preamplifier 214 so as to eliminate the D to A converter 251. Clock strobe signals such as that shown on line 253 are applied to the digital blocks which occur after the A to D converters 229 and 242. The low pass filters 227 and 239 may be constructed as RC filter circuits and the FIR filters 232 and 244 may be constructed in the manner shown in U.S. Pat. No. 4,808,939. U.S. Pat. No. 4,808,939 issued Feb. 28, 1989 for Variable Rate Rectangular Matched Filter by Samuel C. Kingston is hereby incorporated by reference herein. It will be understood that all of the schematic blocks shown in FIG. 10 need not be constructed according to the two patents cited in this paragraph but may be constructed by other equivalent circuits known in the prior art.

FIG. 11 shows a schematic block diagram of a communications receiver which includes the FIG. 10 pre-processing circuitry coupled to a demodulator having output signals coupled to the circuitry for controlling the three tracking loops at four control points. The FIG. 10 receiver 210 is shown having phase rotated outputs 237' and 248, applied as inputs to a demodulator 254. The demodulator 254 may be a commercially available demodulator or the demodulator described in U.S. Pat. No. 5,099,494 cited above. The demodulator 254 is shown having a clock error signal output on line 255, a signal level output on line 256 and a carrier error signal $E_s$ output on line 257. Demodulator 254 is shown having strobe and timing input signals on lines 258 and 259 and PN code sequence inputs on lines 261 and 262.

The signal level on line 256 is indicative of the signal level of the despread data and is applied to digital acquisition and tracking controller 250. Digital acquisition and tracking controller 250 produces digital control signals on line 263 which are capable of slipping the PN generators which provide the I and Q PN codes on lines 261 and 262. The PN timing strobes on line 259 are employed to control the PN generator and to advance the PN generator to the next sequential output. The preferred method of generating the slip of the I or Q PN generator is to delete one of the I or Q PN strobes.

Digital acquisition and tracking controller 250 is adapted to produce a detection signal on output line 265 which indicates the original acquisition correlation and is applied to the switches 266 and 267 at the input of the loop filters 268 and 269 to close the carrier recovery loop 270 and code tracking loop 280.

During initial acquisition the control signal on output line 271 is employed to slip the master clock or system clock 272 which produces the system clock signal on line 273 applied to the timing and control circuit 274 shown producing the sampling clock signal input on line 253 which is applied to the numerous components of the receiver stages 210. The sampling clock or system clock is the base clock signal employed to drive the receiver stages 210, the demodulator 254 and the digital acquisition and tracking controller 250. A plurality of strobe signals from the timing and control circuit 274 are shown on line 275. The code timing loop 280 is shown producing a frequency command signal on line 276 which is applied to the clock synthesizer 277 which produces a system clock signal on output line 278. Clock synthesizer 277 is preferably system 34 of FIGS. 3 and 4. Digital acquisition and tracking controller 250 can for example be as shown in FIG. 3 of U.S. Pat. No. 5,060,180 and described at column 4, line 19 through column 6, line 57 of that patent. Loop filters 68 and 69 can for example each be as shown in FIG. 4 of that patent and described at column 6, line 58 through column 8, line 18 of U.S. Pat. No. 5,060,180.

System 34 of FIGS. 3 and 4 can also be advantageously employed as the clock synthesizer of U.S. Pat. No. 5,128,958.

The coarseness or fineness of the adjustment to the chip-rate clock, and thus of the sampling clock, provided by the apparatus of FIGS. 3 and 4 or the method of FIGS. 5–6 or 7 can be adjusted by respectively decreasing or increasing the value of N, decreasing or increasing the value of M (number of chips per bit or other data symbol) and changing the number of chips affected by apparatus 34. The number of reference clock periods can be changed for more than one chip per bit by inserting, between the DONE output of counter 40 and the RESET input of state machine 38, a counter reset by the symbol strobe and set to count the desired number of chips before it will provide an appropriate reset signal to the RESET input of state machine 38 and whose count would be initiated by presence of the done signal from counter 40. However, the first of the chip or chips to be so modified should be identified by an appropriate timing or synchronization signal. The symbol strobe is used above for this synchronization purpose.

The symbol strobe indicates presence of a new, valid loop filter output. Demodulator 36 can for example be a Unisys PA-100 spread spectrum demodulator.

Although the respective systems of FIGS. 2, 10 and 11 are particularly suitable for use with spread signals, it should be understood that the present invention can be utilized with non-spread signals.

Although a power splitter is shown in FIGS. 1 and 10, the power splitter can be deleted if desired. For example, the three lines shown in FIG. 1 as being connected to the power splitter could instead simply be connected together.

Some of the many advantages of the invention should now be readily apparent. For example, an all-digital low-cost programmable clock circuit for timing recovery such as in direct-sequence spread spectrum (DSSS) communication systems. As is particularly shown in FIGS. 8 and 9, this is preferably implemented as a completely digital implementation that offers significant cost and size reductions over implementations that use analog components. The present invention provides a simple, inexpensive means to implement a variable-rate clock for the purpose of timing recovery in a DSSS or other communications system. Considered particularly advantageous is the use of an all-digital signal processor and programmable divider that preferably modifies the divisor only once per symbol time to provide highly accurate timing resolution. Significant size, cost and power reduction is obtained compared to using an analog clock generator. The present invention with an all-digital implementation is also highly suitable for implementation in an all digital ASIC (application-specific integrated circuit), which could make the per-unit production cost nearly negligible.

As discussed above, the apparatus of FIGS. 3 and 4 is all digital; there are no analog signals employed. In other words, the digital error or command signal, which tells the state machine whether to speed up or slow down or hold, is used to generate a chip rate clock which also is a digital signal without, as an intermediate step, generating any analog signals. The required number of logic gates is thereby substantially reduced, and the system of FIGS. 3 and 4 can be completely integrated. Thus there have been provided apparatus and method for providing a controllable variable-rate clock signal. Apparatus and method have also been provided for accomplishing timing recovery. Apparatus and method have furthermore been provided for providing a variable-rate clock for timing recovery such as in direct-sequence spread spectrum communication systems and other communications systems. Apparatus and method have been provided for producing a controllable variable-rate clock signal that is a completely digital implementation, thereby reducing cost and size over an analog implementation and particularly permitting monolithic or ASIC integration of a timing recovery system incorporating such apparatus or method.

Obviously, many modifications and variations of the present invention are possible in light of the above teachings. It is therefore to be understood that the foregoing embodiments are presented by way of example only and that, within the scope of the appended claims and equivalents thereto, the invention may be practiced otherwise than as specifically described.

What is claimed is:

1. Digital apparatus for correcting a fixed frequency first clocking signal used to demodulate a received analog data stream, comprising:

an analog to digital converter (ADC) for receiving the analog data stream and for producing a digital data stream, digital demodulator means for receiving said digital data stream having a variable chip rate frequency and for recovering said digital data stream, a chip rate clock generator for producing a first chip rate clocking signal for tracking the frequency of said digital data stream, said digital demodulator means having means for producing a digital error signal (Es) indicative of whether the clocking rate of said first chip rate clocking signal should be increased or decreased or held the same, digital signal logic means coupled to said error signal (Es) for generating a signal representing a count value responsive to said the error signal indicating whether the duration of one or more of said first chip rate clocking signals should be increased or decreased or held the same, and digital counting means coupled to receive said count value and for producing a second clocking signal having a clocking rate indicative of the frequency of said digital data stream.

2. Apparatus as defined in claim 1 wherein said digital counting means comprises a fixed frequency clock having a frequency N times greater than that of said first clocking signal, and said digital counting means comprises a frequency divider for dividing said fixed frequency clocking signal by an integer, wherein the frequency of said first clocking signal may be varied and is representative of the fixed frequency value of said second clocking signal divided by a value of N or N−1 or N+1 depending on said error signal.

3. Apparatus as defined in claim 1, wherein the frequency value of said second clocking signal is nominally held at a value of the second clocking signal divided by N, and wherein the duration of one chip rate is changed by one clock count of said fixed frequency clock to effect a virtual change in frequency of said first clocking signal.

4. Apparatus as defined in claim 1, wherein said digital demodulator means comprises a first-order loop filter.

5. Apparatus as defined in claim 4, wherein said apparatus constitutes a second-order phase-locked loop.

6. Apparatus as defined in claim 1, wherein said digital demodulator means comprises a zeroth-order filter.

7. Apparatus as defined in claim 6, wherein said apparatus constitutes a first-order phase-locked loop.

8. Apparatus as defined in claim 1, wherein said digital demodulator means comprises a loop filter.

9. Apparatus as defined in claim 8, wherein said apparatus constitutes a phase-locked loop.

10. Apparatus as defined in claim 1 wherein said digital signal logic means comprises a state machine.

11. Apparatus as defined in claim 1 wherein said digital demodulator means also produces a third clocking signal slower than the first chip rate clocking signal and wherein said digital signal logic means receives the third clocking signal and produces a count signal representing a value of other than N only when triggered to do so by said third clocking signal.

12. Apparatus for timing recovery, comprising:

digital demodulator means, receiving a first chip rate timing signal, for generating a digital error signal (Es) indicative of whether the chip rate period of the first timing signal should be increased, decreased, or held, and for producing a second symbol timing signal indicative of whether a regularly repeated event is to reoccur;

digital logic means for receiving the error signal (Es) and the second symbol timing signal and a reset signal, and for producing a digital count signal representing a value of N, where N is any integer, except that between occurrence of the second symbol timing signal and the resent signal said digital logic means produces a count value having a value greater than, less than or equal to N responsive to whether the error signal indicates that the period of the first timing signal should be increased, decreased or held the same;

digital generating means for generating a clock signal having a frequently N times that of the first timing signal; and digital counting means receiving the clock signal and the count value for producing the reset signal after receiving the count signal triggered by the second timing signal, and for producing the first chip rate timing signal.

13. Apparatus as defined in claim 12 where said digital logic means comprises a state machine that, when triggered by the second symbol timing signal will remain in a first state, moved to a second state and to reset, or moved to a third state and to reset, depending on whether the error signal indicates that the period of the first chip rate timing signal should be of the same, increased or decreased.

* * * * *